United States Patent

Ohnishi et al.

[11] Patent Number: 5,952,086
[45] Date of Patent: Sep. 14, 1999

[54] TITANIUM TARGET FOR SPUTTERING AND METHOD OF MANUFACTURING SAME

[75] Inventors: Takashi Ohnishi, Amagasaki; Yasunori Yoshimura, Osaka; Setsuo Okamoto, Nishinomiya, all of Japan

[73] Assignee: Sumitomo Sitix of Amagasaki, Inc., Tokyo, Japan

[21] Appl. No.: 08/737,313
[22] PCT Filed: Mar. 12, 1996
[86] PCT No.: PCT/JP96/00610
  § 371 Date: Nov. 12, 1996
  § 102(e) Date: Nov. 12, 1996
[87] PCT Pub. No.: WO96/28583
  PCT Pub. Date: Sep. 19, 1996

[30] Foreign Application Priority Data

Mar. 13, 1995 [JP] Japan ........................ 7-81952
Jan. 25, 1996 [JP] Japan ........................ 8-32829

[51] Int. Cl.⁶ .................................... B32B 3/00
[52] U.S. Cl. .................. 428/220; 204/192.15; 428/660; 75/248
[58] Field of Search ................. 428/212, 220, 428/218, 660; 204/192.15; 419/19; 75/248

[56] References Cited

U.S. PATENT DOCUMENTS

| | | | |
|---|---|---|---|
| 4,820,393 | 4/1989 | Brat et al. ........................ | 204/192.15 |
| 4,838,935 | 6/1989 | Dunlop et al. ........................ | 75/230 |
| 5,160,534 | 11/1992 | Hiraki ........................ | 75/248 |
| 5,234,487 | 8/1993 | Wickersham, Jr. et al. ........................ | 75/248 |
| 5,489,367 | 2/1996 | Kubota et al. ........................ | 204/192.15 |
| 5,772,860 | 6/1998 | Sawada et al. ........................ | 204/298.13 |
| 5,798,005 | 8/1998 | Murata et al. ........................ | 148/421 |

OTHER PUBLICATIONS

JP 05–214519 Titanium Sputtering Target; Hanawa et al., Patent Abs. of Japan, vol.17, No.663, Dec. 1993.

JP 05–214521 Titanium Sputtering Target, Hanawa et al., Patent Abs. of Japan,. vol.17, No.663, Dec. 1993.

*Primary Examiner*—Elizabeth Evans
*Attorney, Agent, or Firm*—Oblon, Spivak, McClelland, Maier & Neustadt, P.C.

[57] ABSTRACT

A titanium target for sputtering high in film making efficiency in a contact hole. The crystallization on the target face is caused to be orientated so that the X-ray diffraction strength of the (10 –10) and/or (11 –20) vertical to the close-packed filling face may become 1.1 times or more in a case of the random orientation, and the X-ray diffraction strength of the (0002) parallel to the close-packed filling face may become 1 time or lower in a case of the random orientation. A direction of the sputter grains jumping out of the target face is controlled in a direction vertical to the target face.

38 Claims, 3 Drawing Sheets

(100) = (10$\bar{1}$0)

(110) = (11$\bar{2}$0)

WORKING AT TRANSFORMATION POINT OR LOWER

WORKING AT β REGION

WORKING AT β → α PASSING TIME

TITANIUM TARGET FOR SPUTTERING AND METHOD OF MANUFACTURING SAME

BACKGROUND OF THE INVENTION

1. Field of the Invention

The present invention relates to a titanium target for sputtering and its method of making the titanium target, which is used for forming thin films as working materials or the like in manufacturing semiconductor elements such as LSI, ULSI and so on.

2. The Related Art

In order to solve signal delay because of a narrower line operation of electrode wiring, electrode materials to be used in LSI and ULSI are moving to high purity-high melting point metallic materials of the lower resistance, by increase in quick integration degree of the LSI of recent years, instead of polysilicon conventionally often used. There is molybdenum, tungsten, titanium or their silicides as the high purity-high melting point material to be used in the LSI and the ULSI. Titanium is especially desired in terms of superior specific strength, working property and corrosion proof property.

Sputtering is normally used when an electrode for semiconductor is formed with titanium. A titanium target of high purity to be used in the sputtering is normally manufactured as follows.

A high purity titanium material refined by an iodide thermal cracking method, an electrolysis method or the like is dissolved by a vacuum melting method of EB (electron beam) resolution or the like to make a plate shaped target through processes of casting, forging, rolling, heat treatment or the like. The above described dissolving method is put into practical use although a separating method for manufacturing the titanium target directly by the iodide thermal cracking method is researched.

In the sputtering using such a titanium target, unequal sputtering film thickness is said to be caused form different sputter efficiency through the crystal bearing of the crystal grains of the target. Therefore, the crystal bearing is generally averaged by the refining of the crystal grains of the titanium target. This is because the rolling and heat treatment are effected in the dissolving method.

But it has become extremely difficult to make films by the sputtering into a groove called contact hole because of extreme narrowing in the wiring width accompanied by recent further high integration, because there was no directional property in the sputter grains from the target as shown in FIG. 1 (A) in the titanium target where the crystal bearing is averaged.

As one of the measures, there is a method of arranging collimates between a basic plate and a target as shown in FIG. 1 (B). But in this method, there is a problem in that the sputtering efficiency is considerably lowered, because the sputter grains from the target are adhered on the collimates and the sputter grains to reach to the basic plate are considerably reduced in number. What is considered recently is an art of arranging the direction of the sputter grains from the target as shown in FIG. 1 (C). Japanese Laid-Open Patent Application Tokkaihei No. 5-214521 discloses a titanium target of the crystal structure where a priority bearing is considered around the (0002) parallel to the close-packed filling face from a point of view that the sputter grains are likely to be scattered in the close-packed filling direction of the crystal.

FIG. 2 shows the crystal structure at the room temperature of the titanium. There are (0002) as a face parallel to the close-packed filling face, (10 –10), (11 –20) or the like as a face vertical the close-packed filling face. The titanium target shown in Japanese Laid-Open Patent Application Tokkaihei No. 5-214521 has a similar orientation property, because titanium target manufactured by the general dissolving method is worked at comparatively low temperatures although the crystal is considered to be strongly orientated on the (0002).

In the sputtering into the groove called contact hole, the film making efficiency is made lower than without receiving of the rolling according to the researches by the present inventors although the soluble target where conventionally general crystal grain diameter has been refined is arranged in a sputter grains flying direction as compared with the crystal grain diameter controlled. This is because the scattering direction of the sputter grains is not controlled in a direction vertical to the target surface.

Namely, in the sputtering into the groove called contact hole, a direction of scattering sputter grains in the target is demanded to be controlled in a direction vertical to the target surface, because a direction of the sputter grains vertically with respect to a substrate to be formed in film is required to be controlled. But in the soluble target where conventionally general rolling is received, the sputter grains reaching to the bottom face of the contact hole is considerably reduced in number, because a jumping out direction of sputter grains is controlled in a direction different from the required direction without being controlled in a required direction.

An object of the present invention is to provide a titanium target for sputtering and its method of manufacturing the titanium target where the direction of the sputter grains to fly out from the target surface is controlled in a direction vertical with respect to the target surface.

DISCLOSURE OF THE INVENTION

To achieve the above object, the present inventors have researched the relationship between the crystal bearing on the target surface and the direction of the sputter grains jumping out of the surface. As the result, it has been found out that sputter grains are scattered out in parallel to the close-packed filling face, and the scattering efficiency of the sputter grains becomes higher and the scattering direction is controlled in a direction vertical with respect to the target surface when the crystal structure of the target surface is strongly oriented on the (10 –10) and the (11 –20) vertical to the close-packed filling face.

The titanium target of the present invention becomes 1.1 times or more in the case of the random orientation in the X-ray diffraction strength of the (10 –10) and/or (11 –20) with respect to the close-packed filling face, and desirably 1 time or lower in a case of the random orientation in the X-ray diffraction strength of the (0002) parallel to the further close-packed filling face.

In the titanium target of the present invention, the orientation property of the crystal is controlled by each X-ray diffraction strength of the (10 –10), the (11 –20) and the (0002). Each X-ray diffraction strength is expressed by a ratio (hereinafter referred to as diffraction strength ratio) with each X-ray diffraction strength being 1 in a case of the random orientation. In the case of the random orientation, the refined crystal powder packed within a sample holder used by a X-ray diffraction meter is measured.

The sputter grains are likely to scatter in a direction vertical to the target surface when the (10 –10) and (11 –20) vertical to the close-packed filling face have become the target surface as shown in FIG. 3. To control the scattering direction of the sputter grains into a direction vertical to the target face, it is required to strongly orient the face vertical to the close-packed filling face with at least one of diffraction strength ratio of the (10 –10) and the (11 –20) being made 1.1 or more, and desirably the diffraction strength ratio of further (0002) being 1 or lower.

The desired diffraction strength ratio of the former is 2.0 or more. The desired diffraction strength ratio of the latter is 0.5 or lower. Also, both the diffraction strength ratios are desired to be 1.1 or more than one of the (10 –10) and the (11 –20) and both of them are particularly desired to become 2.0 or more.

The soluble target which has received the conventionally general rolling is not satisfied with the conditions. To satisfy the conditions, measures such as changed cutting direction of the material, rolling temperature higher than conventional, larger rolling pressure reduction ratio or the like are required.

As the titanium target of the present invention has surface crystal structure strongly oriented in the bearing of the (10 –10) and (11 –20) vertical to the close-packed filling face, the direction of the sputter grains jumping out of the target is controlled to a direction vertical to the target face, and film making good in step coverage even to the narrow, deep contact hole can be effected, thus contributing towards the high integration of the semiconductor device.

Also, the titanium target for sputtering use can be easily manufactured by the manufacturing method of the present invention.

DETAILED DESCRIPTION OF THE PREFERRED EMBODIMENTS

A method of manufacturing titanium targets as the embodiments of the present invention will be described hereinafter.

A method of manufacturing a first titanium target of the present invention has steps of strong working of 50% or more in working degree at temperatures of a transformation point or lower as final working operation, and collecting the target so that a face along the working direction may become a target face to contrive chiefly to collect.

In the manufacturing the conventional soluble titanium target, the working operation is effected at temperatures of transformation point or lower as the final working operation. In the case of, for example, forging, the target is collected so that a face orthogonal to the forging direction, namely, the forging material surface may become a target face. But in the working at temperatures of transformation point or lower, the (0002) is oriented in a working direction. Therefore, in the contriving soluble target, the (0002) is adapted to be oriented on the target face.

Figures 1A, 1B, 1C:
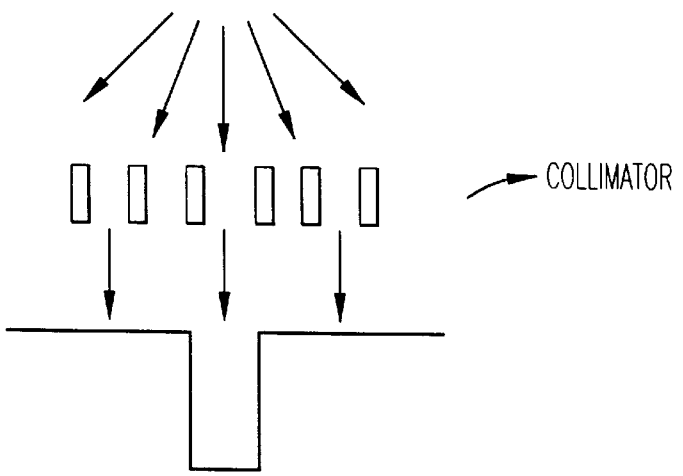
FIG. 1 is a typical view showing film making into a contact hole.
Figure 2A:
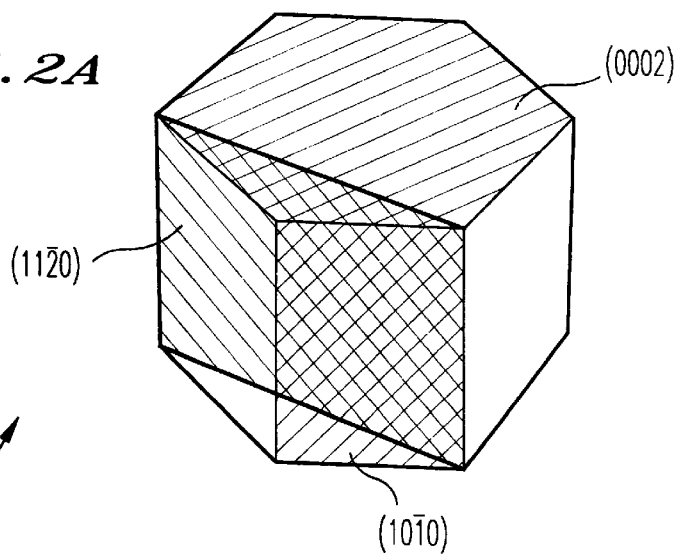
FIG. 2 is a typical view showing the crystal structure of titanium.
Figure 2B:
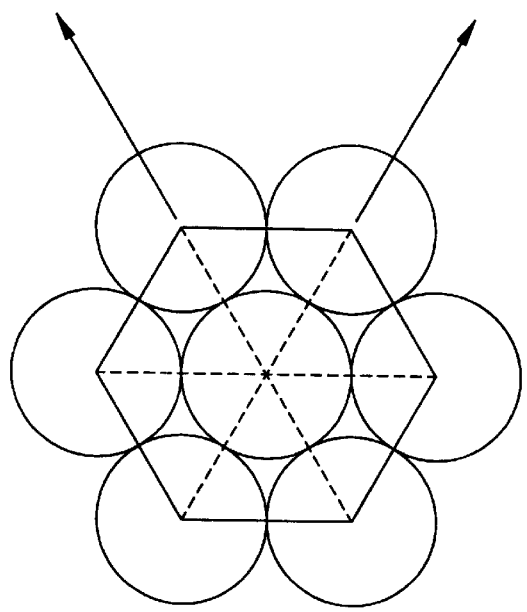
Figure 2C:
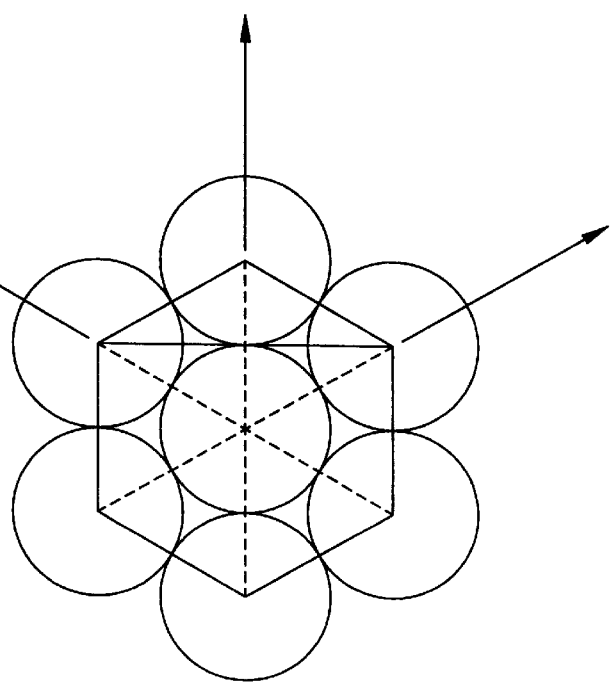
Figure 3A:
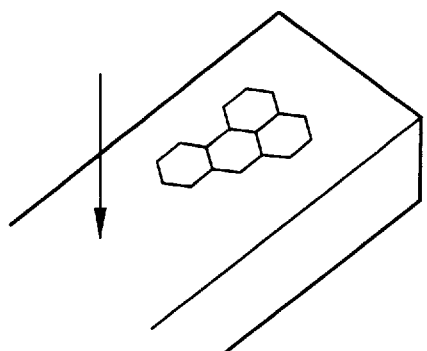
FIG. 3 is a typical view showing a scattering direction of sputter grains.
Figure 3B:
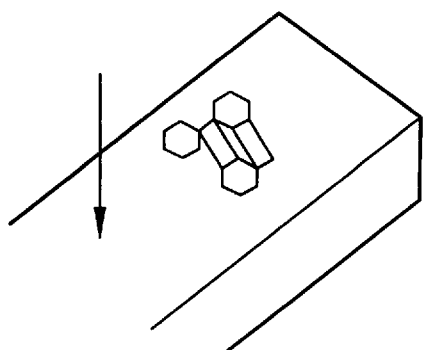
Figure 3C:
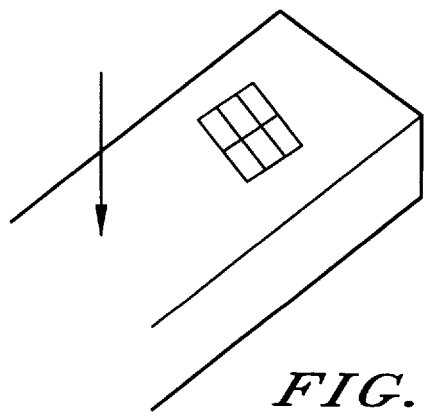
Figure 4:
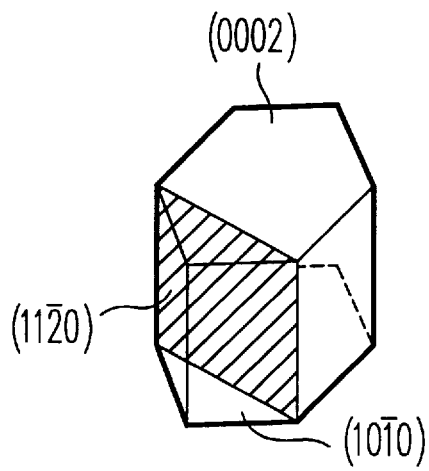
FIG. 4 is a typical view showing the relation between working conditions and orientation property.

On the hand, in the first titanium target manufacturing method of the present invention, a strong working operation is effected at first at temperatures of the transformation point or lower. As shown in FIG. 4 (A), the (0002) is strongly oriented on the face orthogonal to the working direction. The target is collected so that a face (desirably a face parallel to the working direction) along the working direction may become a target face. Thus, a titanium target improved in the (10 –10) and/or (11 –20) on the target face is obtained. Reasons why the (0002) is oriented in the working direction when the working operation has been effected at temperatures of the transformation point or lower are as follows.

The titanium is of the close-packed hexagon structure (h.c.p.) in the α region of the transformation point or lower, with the plasticity deformation mechanism being two, slip deformation and twin crystal deformation. Generally the contribution of the slip deformation with respect to the plasticity deformation of the metallic material is overwhelmingly larger as compared with that of the twin crystal deformation. Even in the pure titanium, the majority of the plasticity deformation is borne by the slip deformation. As the deformation of the titanium is major in the pillar face slip of the (10 –10) <11 –20> and the slip direction is within the bottom face in <11 –20>, C axial deformation is not obtained by the activity of the slip system. Thus, the orientation of the (0002) face vertical to the C axis becomes strong to the working direction (a direction of adding force).

The working temperature in a method of manufacturing the first titanium target of the present invention is desired to be lower. The largest effect is obtained at room temperature, with concretely 600° C. or lower being desired. For improvement in the orientation degree, 70% or more is especially desirable. The manufacturing degree is more desirable when it is larger. The forging or slab rolling where comparatively large thickness is obtained in the working direction even after the working operation is desirable even in the terms of target collecting as the working method.

A method of manufacturing a second titanium target of the present invention has steps of effecting a strong manufacturing operation of 50% or more in manufacturing degree in the β region of the transformation point or more as a final working, and collecting the target so that a face which crosses the working direction may become a target face.

This method is adapted to effect the final working operation at high temperatures. In this case, as shown in FIG. 4 (B), the (0002) is oriented at random, so that partial (10 –10) and/or (11 –20) are oriented in the working direction. Accordingly, the face (desirably a face orthogonal to the working direction) for crossing the working direction is made a target face so that the orientation degree of the (10 –10) and/or (11 –20) or the target face is improved. When the working operation has been effected at high temperatures of transformation point or more, the reason why the (0002) is oriented at random is as follows.

As the titanium is of body-centered cubic crystal structure (b.c.c) in the β region of the transformation point or more, the crystallization is oriented in one direction of the body-centered cubic crystal construction when the working operation has been effected in the β region. But as the material is cooled in any shape, the transformation is effected in accordance with the relation of Burgers from the body-centered cubic structure (b.c.c) to the close-packed hexagonal structure. In this case, six (101)b is transformed into the (0001)h, the (0002) is oriented at random.

The working operation in the second titanium target manufacturing method of the present invention is desirable at temperatures of 1000° C. or lower, because an oxidizing operation becomes violent at higher temperatures. The working degree is particularly desirable at 70% or higher, because the larger manufacturing degree is better for a random operation.

A third titanium target manufacturing method of the present invention has steps of effecting strong working operation of 50% or more in the working degree while passing the β→α transforming point as the final working operation, and collecting the target so that the face crossing the working direction may become the target face.

The method is characterized in that the working operation is effected in passing at the β→α transformation point. In this case, as shown in FIG. 4, (C), the (10 −10) and/or (11 −20) is strongly oriented in the working direction. Accordingly, the titanium target where the (10 −10) and/or (11 −20) is strongly oriented on the target face is obtained by the collection of the target so that the face (desirably a face orthogonal to the working direction) crossing the working direction may become a target face. The reason why the (10 −10) and/or (11 −20) is strongly oriented in a working direction when the working operation has been effected is as follows.

Although the crystallization is oriented in one direction of the body-centered cubic structure when the working of the region of the transformation point or more as in the second method, it is said that only one (101)b of six (101)b is transformed into the (0001)h in the case where the β→α transformation is caused during the working operation. The (10 −10) and (11 −20) vertical to the (0002) are oriented in a working direction, because the (0002) is oriented vertical to the working direction in priority bearing of this case.

The working operation in a third titanium manufacturing method of the present invention is more desirable if the working completion temperature for raising the orientating property is lower, and concretely is desirable to complete the working operation at 700° C. or lower. The working start temperature is desirable to be 1000° C. or lower to prevent oxidation. The larger working degree is better for improving the orientation property in terms of working degree, and especially 70% or lower is desirable.

Even in any titanium target manufacturing method of the present invention, the film thickness distribution at the sputtering is equalized by the use of the cross rolling as working. As the result, the number of grains reaching to the bottom face of contact hole increases.

The cross rolling is an art of rolling by movement of the material in a direction (eight directions each being deviated desirably by 45°). The X-ray diffraction strength of a material rolled in one direction and the X-ray diffraction strength of a cross rolled material are almost the same if the other rolling conditions are the same. But in the case of individual crystal, the individual crystal of a material rolled in one direction is directed at a constant direction depending the rolling direction. As the result, in the use thereof as the target for sputtering use, a direction of scattering the grains is excessively arranged, thus resulting in unequal film thickness. Influence in the rolling direction are relaxed and the film thickness is made unequal by making the direction of the individual crystal random by the cross rolling.

Even in either titanium target manufacturing method of the present invention, the heat treatment for crystal grain refining operation after the final working operation is effective for improvement in the direction controlling property of the sputter particles. Concretely, 500 μm or lower in particle diameter is desirable, and 100 μm or lower is more desirable. 50 μm or lower is especially desirable.

The embodiments of the present invention will be shown hereinafter. The effect of the present invention will be apparent through the comparison with the comparison example.

In manufacturing of the sputtering target with the use of a titanium cast material in high purity on the market, the working conditions of Table 1 has been adopted for controlling the crystal orientating property of the target. Table 2 shows the crystal orientating property in the surface of the made titanium target. The shown orientating property is expressed at a ratio with the X-ray diffraction strength of each bearing of titanium powder being 1 through the measurement of the X-ray orientation property in each bearing by the X-ray diffraction method.

Also, the sputtering operation has been effected with the use of the made titanium target. A contact hole of 1.0 μm wide×2.0 μm deep has been provided on the surface of the substratum. The average film thickness of the thin film obtained by the sputtering is approximately 500 angstroms.

Table 3 shows measured results of the film making speed and the film thickness distribution in a portion except the contact hole, and the step coverage in the contact hole. The film making speed is expressed by the (average film thickness/sputtering time). The film thickness distribution is expressed by (maximum film thickness−minimum film thickness)/(average film thickness×2)×100(%). Also, the step coverage in the contact hole is expressed by the (average film thickness/average film thickness except the hole)×100(%).

TABLE 1

| No. | WORKING CONDITIONS OF TARGET MATERIALS |
|---|---|
| 1 | (casting material) → 900° C. forging → 500° C. rolling (pressure reduction rate: 70%) → cutting (A) |
| 2 | (casting material) → 500° C. forging (working rate: 50%) → cutting (A) |
| 3 | (casting material) → 500° C. forging (working rate: 50%) → cutting (B) |
| 4 | (casting material) → 500° C. forging (working rate: 50%) → cutting (C) |
| 5 | (casting material) → 900° C. forging → 950° C. rolling (pressure reduction rate: 70%) → cutting (A) |
| 6 | (casting material) → 900° C. forging → 900° C. rolling (pressure reduction rate: 70%) → cutting (A) |
| 7 | (casting material) → 900° C. forging → 950° C. rolling (cross, pressure reduction rate: 70%) → cutting (A) |
| 8 | (casting material) → 900° C. forging → 950° C. rolling (pressure reduction rate: 70%) → 800° C. heat treatment → cutting (A) |
| 9 | (casting material) → 900° C. forging → 950° C. rolling (pressure reduction rate: 70%) → 700° C. heat treatment → cutting (A) |
| 10 | (casting material) → 900° C. forging → 950° C. rolling (pressure reduction rate: 70%) → 600° C. heat treatment → cutting (A) | cutting (A): cutting so that a face orthogonal to the working direction becomes a target face
cutting (B): cutting so that a face parallel to the working direction becomes a target face
cutting (C): cutting so that a face of 45° with respect to working direction becomes a target face

TABLE 2

| No. | (100)* | (002)* | (101)* | (102)* | (110)* | (103)* | (112)* | (201)* |
|---|---|---|---|---|---|---|---|---|
| 1 | 0.7 | 2.5 | 0.8 | 0.6 | 0.4 | 1.5 | 0.7 | 0.5 |
| 2 | 1.1 | 1.5 | 1.1 | 0.7 | 0.5 | 1.0 | 1.1 | 0.4 |
| 3 | 1.0 | 0.6 | 0.9 | 0.9 | 1.2 | 0.9 | 0.8 | 0.7 |
| 4 | 0.9 | 0.8 | 1.2 | 0.8 | 1.0 | 0.7 | 1.0 | 0.8 |
| 5 | 0.8 | 0.6 | 1.4 | 0.7 | 2.4 | 0.6 | 0.9 | 0.8 |
| 6 | 2.5 | 0.5 | 1.0 | 0.4 | 2.0 | 0.6 | 0.8 | 0.7 |
| 7 | 0.9 | 0.7 | 1.1 | 0.7 | 2.1 | 0.5 | 0.8 | 0.8 |
| 8 | 0.8 | 0.5 | 1.2 | 0.6 | 2.0 | 0.6 | 0.9 | 0.9 |
| 9 | 0.8 | 0.6 | 1.4 | 0.7 | 2.2 | 0.8 | 0.8 | 0.7 |
| 10 | 0.7 | 0.5 | 1.3 | 0.7 | 2.1 | 0.7 | 0.8 | 0.9 |

(*)(100) = (10—10), (002) = (00 02)
(101) = (10–11), (102) = (10–12)
(110) = (11–20), (103) = (10–13)
(112) = (11–22), (201) = (20–21)

TABLE 3

| No | FILM MAKING SPEED (nm/s) | FILM THICKNESS DISTRIBUTION (%) | STEP COVERAGE IN CONTACT HOLE (%) |
|---|---|---|---|
| 1 | 1.5 | 17 | 28 |
| 2 | 1.4 | 18 | 32 |
| 3 | 1.8 | 14 | 45 |
| 4 | 1.7 | 15 | 38 |
| 5 | 2.0 | 12 | 47 |
| 6 | 2.4 | 10 | 55 |
| 7 | 2.2 | 12 | 57 |
| 8 | 2.1 | 9 | 51 |
| 9 | 2.2 | 7 | 62 |
| 10 | 2.2 | 6 | 65 |

No. 1 is produced by a normal process as a soluble target. Namely, a rolling operation has been effected at 500° C. of transformation point or lower. A normal cutting operation has been effected so that a face (rolling face) orthogonal to the working direction may become a target face. The film making speed, the film thickness uniformity and the step coverage in the contact hole are low, because crystallization is strongly orientated upon the (0002) on the target face.

No. 2 through 4 is effected at 500° C. of transformation point or lower as the final working operation. The No. 2 where the normal cutting operation in which a face orthogonal to the working direction becomes a target face is effected is low in the film making speed, the film thickness equality and the step coverage as in the No. 1, because the (0002) is strongly orientated on the target face.

On the other hand, as the cutting operation is effected at the No. 3 so that a face parallel to the working direction may become a target face, the (11 –20) is comparatively strongly oriented on the target face and a orientating inclination is seen even in the (110 –10) so that the film making speed so that the film thickness equality and the step coverage are both improved. No. 4 where the inclination cutting operation of 45° has been effected with respect to the working direction is improved in the film making speed, the film thickness equality property and the step coverage as compared with the No. 2.

No. 5 has effected the normal cutting operation, effecting a strong rolling operation in the β region of the transformation point or more. The (11 –20) is strongly orientated upon the target face by the normal cutting operation so that the film making speed, the film thickness equal property and the step coverage are considerably improved.

No. 6 has effected the strong rolling operation across 800° C. of the transformation point or lower from the 900° C. in the β region of the transformation point or more. The (10 –10) and the (11 –20) are strongly oriented upon the target face by the normal cutting operation so that the film making speed, the film thickness equality and the step coverage are further improved by the normal cutting operation.

No. 7 uses a cross rolling operation as rolling in No. 5 where a strong rolling operation has been effected in the β region of transformation point or more. The orientation property in the target face is lowered, but the film thickness equal property and the step coverage are improved.

No. 8 through 10 effect the heat treatment for crystal grain refining operation after the final working operation. The crystal grain diameter is respectively 500 μm at No. 8, 100 μm in No. 9, 50 μm at No. 10. The film thickness equal property and the step coverage are improved as the crystal grain diameter becomes smaller.

Among the No. 3, 5, 6, the characteristics of the No. 6 are especially good where both the diffraction strength ratios of the (10 –10) and (11 –20) become 2.0 or more, and the diffraction strength ratio of the (0002) becomes 0.5 or lower.

Although the above described embodiments show soluble targets, they may be applicable even to the above described separation target.

Use Possibility in Industry

As described above, the titanium target for sputtering use of the present invention is useful in forming thin films as working materials or the like in the manufacturing semiconductor elements, because the direction of the sputter grains jumping from the target is controlled in a direction vertical to the target face.

What is claimed is:

1. A titanium sputtering target comprising a titanium target face, wherein
   the target face produces at least one X-ray diffractometer peak, corresponding to at least one of (10 –10) and (11 –20) titanium lattice planes, that is 1.1 or more times stronger than in a titanium X-ray powder diffraction pattern.

2. The titanium sputtering target according to claim 1, wherein the target face produces an X-ray diffractometer peak, corresponding to the (0002) titanium lattice plane, that is of a strength less than that found in a titanium X-ray powder diffraction pattern.

3. The titanium sputtering target according to claim 1, wherein the target face is polycrystalline.

4. The titanium sputtering target according to claim 1, wherein the target face is substantially planar.

5. The titanium sputtering target according to claim 1, further comprising an electrode attached to the target.

6. A sputtering system comprising the titanium sputtering target according to claim 1 and a substrate comprising a substrate surface, wherein the target face is opposite to the substrate surface.

7. The sputtering system according to claim 6, wherein the substrate surface is substantially planar.

8. The sputtering system according to claim 7, wherein the target face is substantially parallel to the substrate surface.

9. A sputtering system comprising the titanium sputtering target according to claim 2 and a substrate comprising a substrate surface, wherein the target face is opposite to the substrate surface.

10. A method of manufacturing a titanium sputtering target, the method comprising forging in a working direction a titanium cast material at temperatures at or above a $\beta \rightarrow \alpha$ transformation temperature so that the titanium cast material is deformed 50% or more in the working direction, thereby forming a forged titanium material, and cutting the forged titanium material across the working direction to form the target face of the titanium sputtering target according to claim 1.

11. The method according to claim 10, wherein the forged titanium material is cut substantially perpendicular to the working direction.

12. The method according to claim 10, further comprising heating the forged titanium material to recrystallize the forged titanium material.

13. A method of manufacturing a titanium sputtering target, the method comprising forging in a working direction a titanium cast material while passing a $\beta \rightarrow \alpha$ transformation temperature so that the titanium cast material is deformed 50% or more in the working direction, thereby forming a forged titanium material, and cutting the forged titanium material across the working direction to form the target face of the titanium sputtering target according to claim 1.

14. The method according to claim 13, wherein the forged titanium material is cut substantially perpendicular to the working direction.

15. The method according to claim 13, further comprising heating the forged titanium material to recrystallize the forged titanium material.

16. A method of manufacturing a titanium sputtering target, the method comprising forging in a working direction a titanium cast material at temperatures below a $\beta \rightarrow \alpha$ transformation temperature, so that the titanium cast material is deformed 50% or more in the working direction, thereby forming a forged titanium material, and cutting the forged titanium material along the working direction to form the target face of the titanium sputtering target according to claim 1.

17. The method according to claim 16, further comprising cross rolling the forged titanium material.

18. The method according to claim 17, further comprising heating the forged titanium material to recrystallize the forged titanium material.

19. The method according to claim 16, further comprising heating the forged titanium material to recrystallize the forged titanium material.

20. The method according to claim 16, wherein the forged titanium material is cut substantially parallel to the working direction.

21. A method of sputtering from a titanium sputtering target, the method comprising positioning the titanium sputtering target according to claim 1 so that the target face is opposite to a substrate having a substrate surface, and sputtering a titanium film on the substrate surface.

22. The method according to claim 21, wherein the substrate surface is substantially planar.

23. The method according to claim 22, wherein the target face is substantially parallel to the substrate surface.

24. A method of manufacturing a titanium sputtering target, the method comprising forging in a working direction a titanium cast material at temperatures at or above a $\beta \rightarrow \alpha$ transformation temperature so that the titanium cast material is deformed 50% or more in the working direction, thereby forming a forged titanium material, and cutting the forged titanium material across the working direction to form the target face of the titanium sputtering target according to claim 2.

25. The method according to claim 24, further comprising cross rolling the forged titanium material.

26. The method according to claim 25, further comprising heating the forged titanium material to recrystallize the forged titanium material.

27. The method according to claim 24, further comprising heating the forged titanium material to recrystallize the forged titanium material.

28. A method of manufacturing a titanium sputtering target, the method comprising forging in a working direction a titanium cast material while passing a $\beta \rightarrow \alpha$ transformation temperature so that the titanium cast material is deformed 50% or more in the working direction, thereby forming a forged titanium material, and cutting the forged titanium material across the working direction to form the target face of the titanium sputtering target according to claim 2.

29. The method according to claim 28, further comprising cross rolling the forged titanium material.

30. The method according to claim 29, further comprising heating the forged titanium material to recrystallize the forged titanium material.

31. The method according to claim 28, further comprising heating the forged titanium material to recrystallize the forged titanium material.

32. A method of manufacturing a titanium sputtering target, the method comprising forging in a working direction a titanium cast material at temperatures below a $\beta \rightarrow \alpha$ transformation temperature, so that the titanium cast material is deformed 50% or more in the working direction, thereby forming a forged titanium material, and cutting the forged titanium material along the working direction to form the target face of the titanium sputtering target according to claim 2.

33. The method according to claim 32, further comprising cross rolling the forged titanium material.

34. The method according to claim 33, further comprising heating the forged titanium material to recrystallize the forged titanium material.

35. The method according to claim 32, further comprising heating the forged titanium material to recrystallize the forged titanium material.

36. The titanium sputtering target according to claim 2, wherein the target face is polycrystalline.

37. The titanium sputtering target according to claim 2, further comprising an electrode attached to the target.

38. A method of sputtering from a titanium sputtering target, the method comprising positioning the titanium sputtering target according to claim 2 so that the target face is opposite to a substrate having a substrate surface, and sputtering a titanium film on the substrate surface.

* * * * *